(12) United States Patent
Ko et al.

(10) Patent No.: US 12,520,663 B2
(45) Date of Patent: Jan. 6, 2026

(54) TRANSPARENT DISPLAY APPARATUS

(71) Applicant: LG Display Co., Ltd., Seoul (KR)

(72) Inventors: Taehee Ko, Paju-si (KR); Binn Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 554 days.

(21) Appl. No.: 17/978,007

(22) Filed: Oct. 31, 2022

(65) Prior Publication Data

US 2023/0209882 A1    Jun. 29, 2023

(30) Foreign Application Priority Data

Dec. 23, 2021    (KR) .................. 10-2021-0186145

(51) Int. Cl.
  *H10K 50/86*    (2023.01)
  *H10K 59/131*   (2023.01)
  *H10K 59/88*    (2023.01)

(52) U.S. Cl.
  CPC .......... *H10K 50/86* (2023.02); *H10K 59/131* (2023.02); *H10K 59/88* (2023.02)

(58) Field of Classification Search
  CPC ...... H10K 50/86; H10K 59/131; H10K 59/88; H10K 59/38; H10K 59/121; H10K 59/35; G02F 1/134345; G02F 1/13452; G02F 1/13458; G02F 1/136286
  See application file for complete search history.

(56) References Cited

U.S. PATENT DOCUMENTS

| | | | |
|---|---|---|---|
| 2016/0349565 A1 | 12/2016 | Kim et al. | |
| 2018/0090398 A1* | 3/2018 | Park | H10K 59/40 |
| 2019/0189075 A1* | 6/2019 | Kim | G02F 1/136204 |
| 2021/0057460 A1* | 2/2021 | Park | H01L 21/32139 |
| 2021/0065610 A1* | 3/2021 | Xu | G11C 19/28 |

FOREIGN PATENT DOCUMENTS

| | | | | |
|---|---|---|---|---|
| CN | 103376606 A | 10/2013 | | |
| CN | 106652927 A | 5/2017 | | |
| CN | 111261043 A | 6/2020 | | |
| CN | 112992925 A | 6/2021 | | |
| JP | 7010639 B2 * | 1/2022 | ............ | H01L 22/30 |
| KR | 102162442 B1 * | 10/2020 | ........... | H10K 50/805 |
| KR | 20210038517 A | 4/2021 | | |

* cited by examiner

*Primary Examiner* — Steven B Gauthier
*Assistant Examiner* — Alvin L Lee
(74) *Attorney, Agent, or Firm* — Seed Intellectual Property Law Group LLP

(57) ABSTRACT

A transparent display apparatus is provided, in which reflection visibility between a display area and a non-display area is improved. The transparent display apparatus comprises a substrate provided with a display area, in which a plurality of pixels having a transmissive portion and a plurality of subpixels are disposed, and a non-display area near the display area, having a pad area, a line portion provided in the non-display area on the substrate, having a plurality of lines connected to the pad area, and a circuit portion having a plurality of circuits connected to the plurality of lines in the non-display area, wherein the line portion is disposed to be separated from the circuit portion.

16 Claims, 9 Drawing Sheets

TRANSPARENT DISPLAY APPARATUS

CROSS-REFERENCE TO RELATED APPLICATIONS

This application claims the benefit of the Korean Patent Application No. 10-2021-0186145 filed on Dec. 23, 2021, which is hereby incorporated by reference as if fully set forth herein.

BACKGROUND

Technical Field

The present disclosure relates to a transparent display apparatus.

Description of the Related Art the advancement of the information age, the demand for a display device for displaying an image has increased in various forms. Therefore, various types of display devices such as a liquid crystal display (LCD) device, a plasma display panel (PDP) device, an organic light emitting display (OLED) device and a quantum dot light emitting display (QLED) device have been recently used.

Recently, studies for a transparent display apparatus in which a user may view objects or images positioned at an opposite side by transmitting the display apparatus are actively ongoing.

The transparent display apparatus includes a display area on which an image is displayed, and a non-display area that includes a bezel area, wherein the display area may include a transmissive area capable of transmitting external light, and a non-transmissive area.

Meanwhile, a plurality of circuits and a plurality of lines for driving a pixel of a display area are disposed in the non-display area, whereas a plurality of pixels are disposed in the display area to display an image. Therefore, since the display area and the non-display area are different from each other in their structures, a problem occurs in that a difference in reflection visibility with respect to external light occurs. This problem related to reflection visibility occurs more seriously in the case that a plurality of lines and a plurality of circuits are alternately disposed in the non-display area.

BRIEF SUMMARY

The present disclosure has been made in view of the above problems and it is an object of the present disclosure to provide a transparent display apparatus in which reflection visibility between a display area and a non-display area is improved.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a transparent display apparatus comprising a substrate provided with a display area, in which a plurality of pixels having a transmissive portion and a plurality of subpixels are disposed, and a non-display area near the display area, having a pad area, a line portion provided in the non-display area on the substrate, having a plurality of lines connected to the pad area, and a circuit portion having a plurality of circuits connected to the plurality of lines in the non-display area, wherein the line portion is disposed to be separated from the circuit portion.

In accordance with another aspect of the present disclosure, the above and other objects can be accomplished by the provision of a transparent display apparatus comprising a substrate provided with a display area, in which a plurality of pixels having a transmissive portion and a plurality of subpixels are disposed, and a non-display area near the display area, having a pad area, a line portion provided in the non-display area on the substrate, having a plurality of lines connected to the pad area, and a circuit portion having a plurality of circuits connected to the plurality of lines in the non-display area, wherein the circuit portion is disposed between the line portion and the display area.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
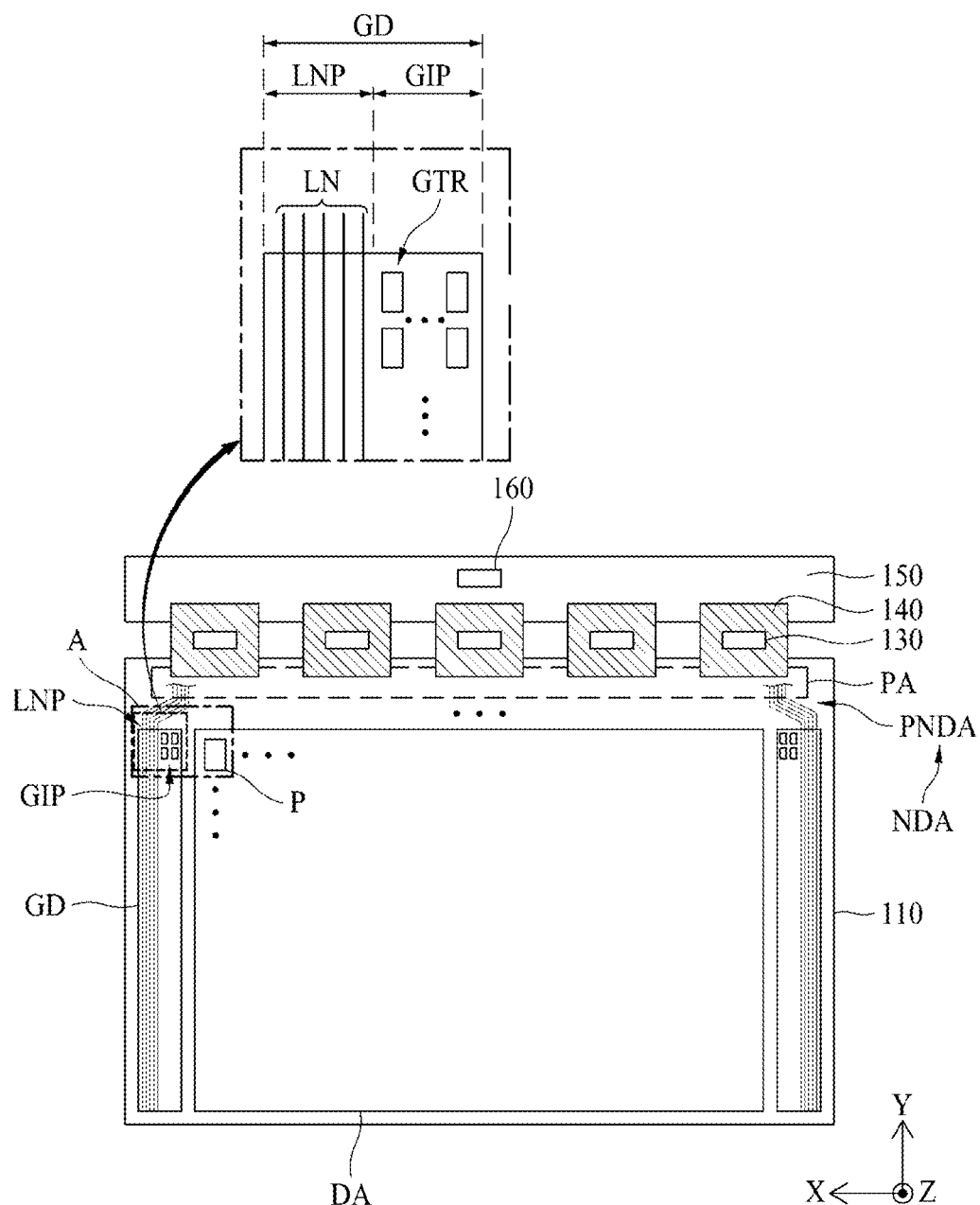
FIG. 1 is a plan view illustrating a transparent display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details.

Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the preferred embodiments of the present disclosure will be described in detail with reference to the accompanying drawings.

Figure 2A:
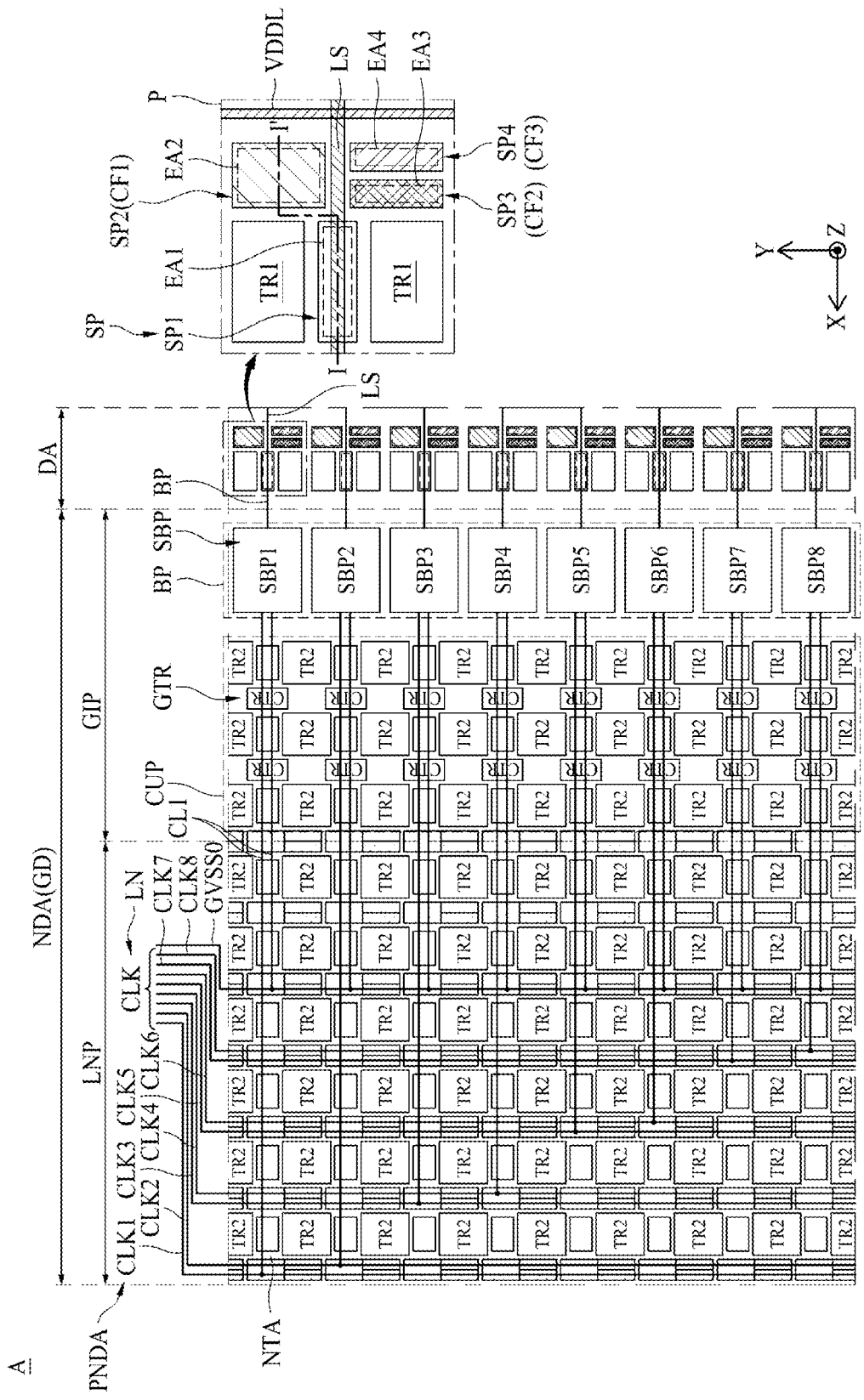
FIG. 2A is a schematic enlarged view illustrating a connection relation among a plurality of clock lines, a ground line and a buffer portion in a portion A of FIG. 1.
Figure 2B:
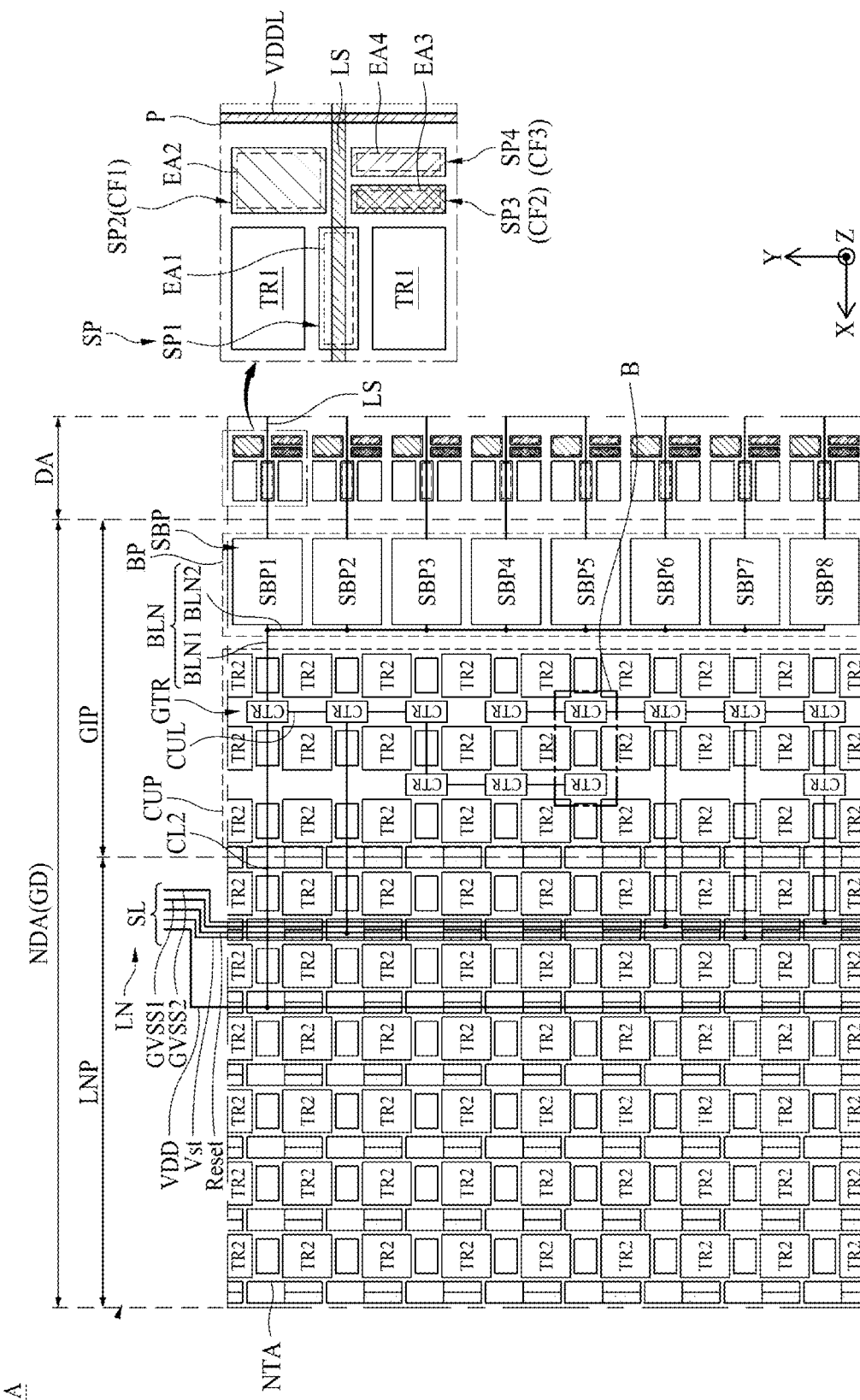
FIG. 2B is a schematic enlarged view illustrating a connection relation among a plurality of signal lines, a common controller and a buffer portion in a portion A of FIG. 1.
Figure 3A:
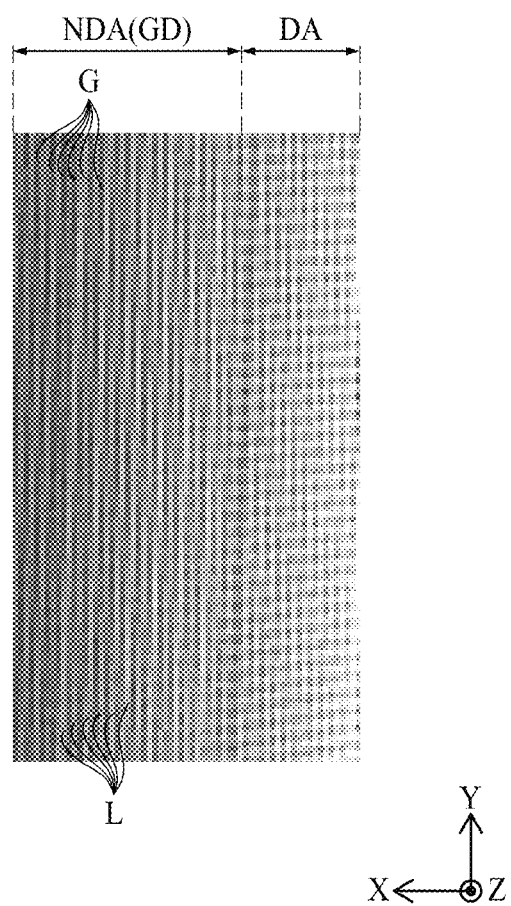
FIG. 3A is a comparison example illustrating reflection visibility in a case that lines and circuits are alternately disposed.
Figure 3B:
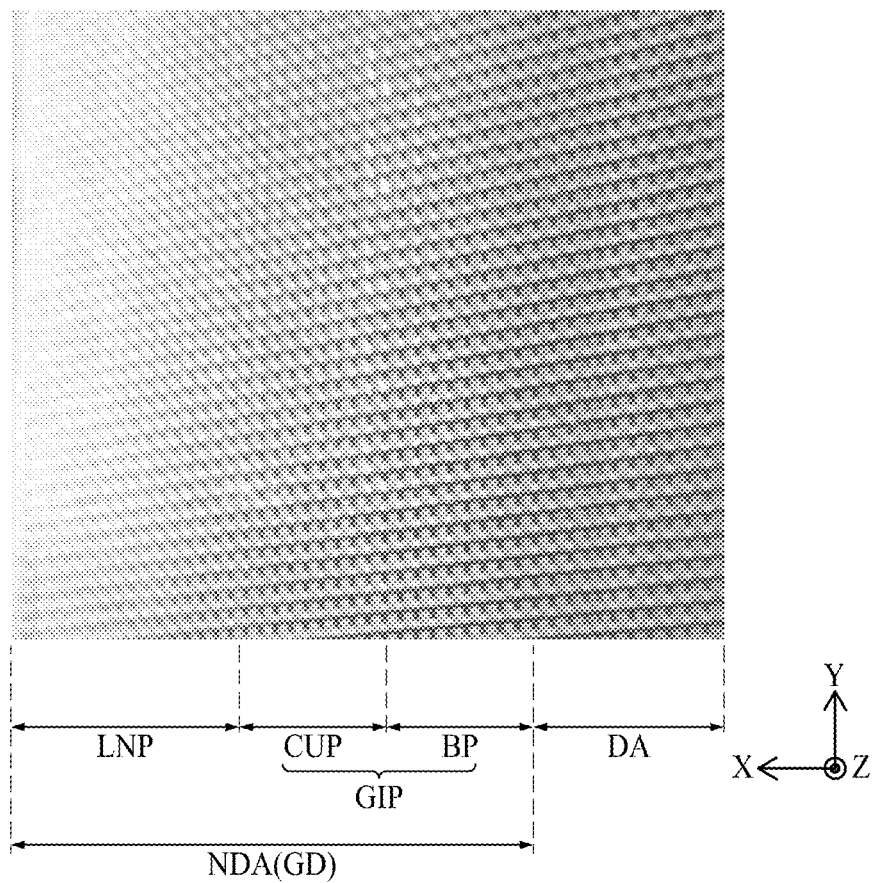
FIG. 3B is a view illustrating reflection visibility in a case that a plurality of lines and a plurality of circuits are disposed separately in a transparent display apparatus according to one embodiment of the present disclosure.
Figure 4:
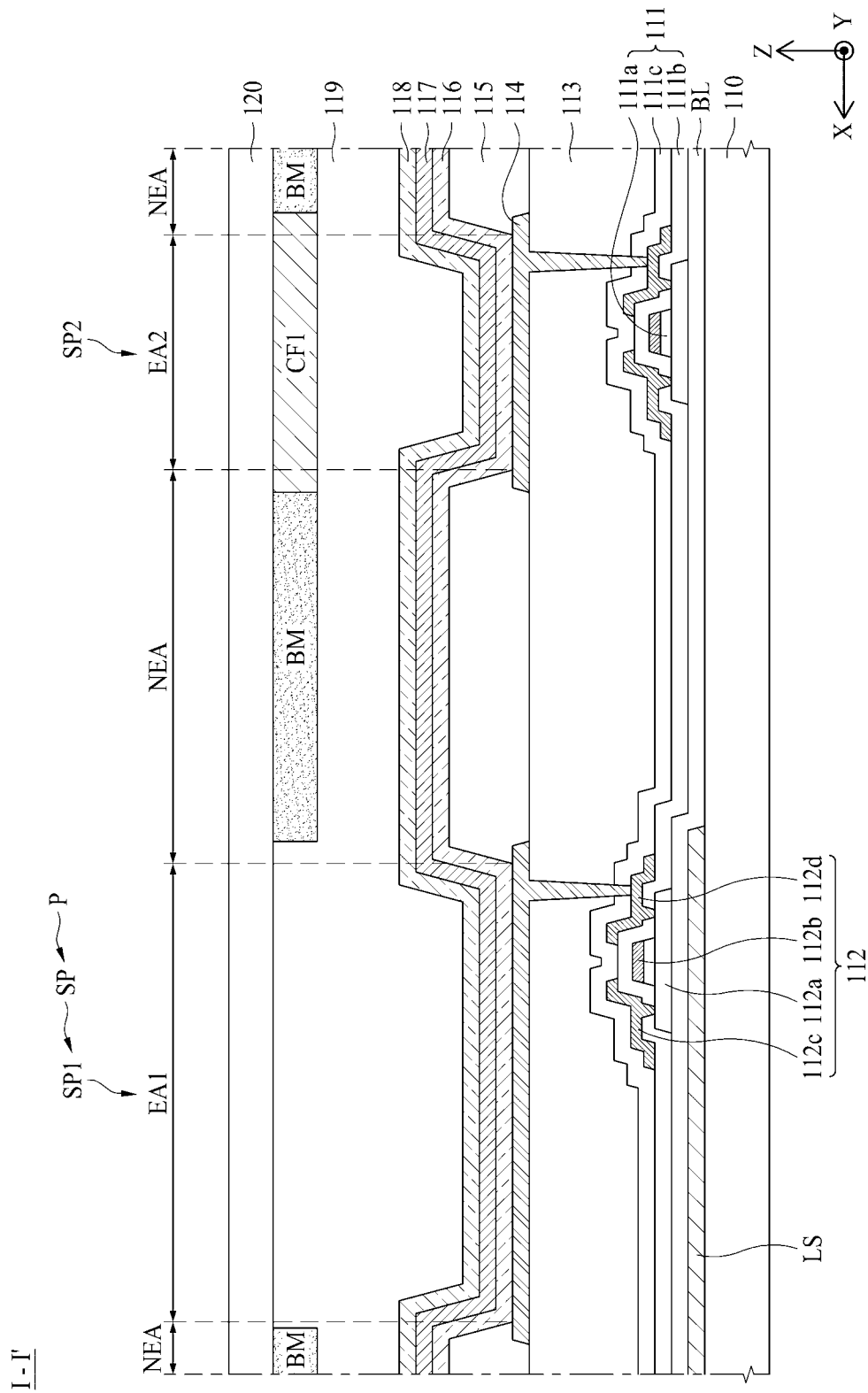
FIG. 4 is a schematic cross-sectional view taken along line I-I' shown in FIG. 2A.

FIG. 1 is a plan view illustrating a transparent display apparatus according to one embodiment of the present disclosure, FIG. 2A is a schematic enlarged view illustrating a connection relation among a plurality of clock lines, a ground line and a buffer portion in a portion A of FIG. 1, FIG. 2B is a schematic enlarged view illustrating a connection relation among a plurality of signal lines, a common controller and a buffer portion in a portion A of FIG. 1, FIG. 3A is a comparison example illustrating reflection visibility in a case that lines and circuits are alternately disposed, FIG. 3B is a view illustrating reflection visibility in a case that a plurality of lines and a plurality of circuits are disposed separately in a transparent display apparatus according to one embodiment of the present disclosure, and FIG. 4 is a schematic cross-sectional view taken along line I-I' shown in FIG. 2A.

Hereinafter, the following description will be based on that a transparent display apparatus 100 according to one embodiment of the present disclosure is an organic light emitting display apparatus, but is not limited thereto. That is, the transparent display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

Referring to FIGS. 1 to 4, a transparent display apparatus 100 according to one embodiment of the present disclosure may include a display panel including a gate driver GD having a line portion LNP and a circuit portion GIP, a source drive integrated circuit (hereinafter, referred to as "IC") 130, a flexible film 140, a circuit board 150 and a timing controller 160.

The line portion LNP may include a plurality of lines LN. The circuit portion GIP may include a plurality of circuits GTR. The line portion LNP and the circuit portion GIP may be disposed to be separated from each other. Therefore, in the transparent display apparatus 100 according to one embodiment of the present disclosure, a plurality of lines may be disposed to be concentrated on one side of the circuit portion GIP, and the plurality of circuits GTR may be disposed to be concentrated on the other side of the line portion LNP. Therefore, in the transparent display apparatus 100 according to one embodiment of the present disclosure, a difference in reflection visibility with respect to external light may be reduced as compared with a case that the plurality of lines and the plurality of circuits are alternately disposed. This will be described later in detail.

The display panel may include a substrate 110 and an opposite substrate 120 (shown in FIG. 4), which are bonded to each other.

The substrate 110 may include a thin film transistor, and may be a transistor array substrate, a lower substrate, a base substrate, or a first substrate. The substrate 110 may be a transparent glass substrate or a transparent plastic substrate. For example, the substrate 110 may be a transparent glass substrate. Hereinafter, the substrate 110 will be defined as a first substrate.

The opposite substrate 120 may be bonded to the first substrate 110 via a transparent connection member (not shown). For example, the opposite substrate 120 may have a size smaller than that of the first substrate 110, and may be bonded to the remaining portion except the pad area of the first substrate 110. The transparent connection member may be an adhesive member (or transparent adhesive). The opposite substrate 120 may be an upper substrate, a second substrate, or an encapsulation substrate. The opposite substrate 120 may be bonded to a first surface of the first substrate 110 by a substrate bonding process using an adhesive member. Hereinafter, the opposite substrate 120 will be defined as a second substrate.

The first substrate 110 according to an example may include a display area DA and a non-display area NDA.

The display area DA is an area where an image is displayed, and may be a pixel array area, an active area, a pixel array unit, a display unit, or a screen. For example, the display area DA may be disposed at a central portion of the display panel DP.

The display area DA according to an example may include gate lines, data lines, pixel driving power lines, and a plurality of pixels P (shown in FIG. 2). Each of the plurality of pixels P may include a plurality of subpixels SP that may be defined by the gate lines and the data lines, and a transmissive portion TR1 disposed to be adjacent to some or all of the plurality of subpixels SP. The transmissive portion TR1 is an area provided to allow light to transmit front and rear surfaces of the display panel. Therefore, a user located in the direction of the front surface of the display panel may view an image or background positioned in the direction of the rear surface of the display panel through the transmissive portion TR1.

Each of the plurality of subpixels SP may be defined as a minimum unit area in which light is actually emitted.

According to an example, at least four subpixels disposed to be adjacent to one another among the plurality of subpixels SP, and one transmissive portion TR1 constitute one unit pixel P. One transmissive part TR1 included in the unit pixel may be divided into a plurality of portions. One unit pixel may include, but is not limited to, a red subpixel, a green subpixel, a blue subpixel, a white subpixel, and a transmissive portion TR1. As an example, one unit pixel may include at least one red subpixel, at least one green subpixel, at least one blue subpixel, at least one white subpixel, and at least one transmissive portion TR1. In one embodiment, a pixel has two transmissive portions TR1 and four sub-pixels, example of which are shown in FIGS. 2A and 2B.

According to another example, three subpixels disposed to be adjacent to one another among the plurality of subpixels SP, and one transmissive portion TR1 constitute one unit pixel. One unit pixel may include, but is not limited to, at least one red subpixel, at least one green subpixel, at least one blue subpixel, and at least one transmissive portion TR1.

Each of the plurality of subpixels SP includes a thin film transistor and a light emitting portion connected to the thin film transistor. The light emitting portion may include a light emitting element layer (or organic light emitting layer) interposed between a first electrode and a second electrode.

The light emitting element layers respectively disposed in the plurality of subpixels SP may individually emit light of their respective colors different from one another or commonly emit white light. According to an example, when the light emitting element layers of the plurality of subpixels SP commonly emit white light, each of the red subpixel, the green subpixel and the blue subpixel may include a color filter (or wavelength conversion member) for converting white light into light of its respective different color. In this case, the white subpixel according to an example may not include a color filter. In the transparent display apparatus 100 according to one embodiment of the present disclosure, a white subpixel may be a first subpixel SP1, a red subpixel may be a second subpixel SP2, a green subpixel may be a third subpixel SP3, and a blue subpixel may be a fourth subpixel SP4.

Each of the subpixels SP supplies a predetermined current to the organic light emitting element in accordance with a data voltage of the data line when a gate signal is input from the gate line by using the thin film transistor. For this reason, the light emitting portion of each of the subpixels may emit light with a predetermined brightness in accordance with the predetermined current. A structure of each of the subpixels SP will be described later with reference to FIG. 4.

The non-display area NDA may be an area where an image is not displayed, and may be a peripheral circuit area, a signal supply area, a non-active area, or a bezel area. The non-display area NDA may be configured to be around the display area DA. That is, the non-display area NDA may be disposed to surround the display area DA.

In the transparent display apparatus 100 according to one embodiment of the present disclosure, a pad area PA may be disposed in a non-display area NDA. The pad area PA may supply a power source and/or signal for outputting an image to a pixel P provided in a display area DA. Hereinafter, the non-display area NDA in which the pad area PA is disposed will be defined as a pad non-display area PNDA.

The gate driver GD supplies gate signals to the gate lines in accordance with the gate control signal input from the timing controller 160. The gate driver GD may be formed on one side of the display area DA of the display panel or on the non-display area NDA outside both sides of the display area DA in a gate driver in panel (GIP) method as shown in FIG. 1. Alternatively, the gate driver GD may be manufactured as a driving chip, packaged in a flexible film and attached to the non-display area NDA outside one side or both sides of the display area DA of the display panel DP by a tape automated bonding (TAB) method. The gate driver GD according to one example may include a plurality of circuits and a plurality of lines. The plurality of circuits may be gate driving circuits (or GIP circuits). The plurality of GIP lines may be a plurality of clock lines CLK and a plurality of ground lines and a plurality of signal lines SL.

The plurality of gate drivers GD may be disposed at a left side of the display area DA, that is, a first non-display area and a right side of the display area DA, that is, a second non-display area. According to one example, the plurality of gate drivers GD may be connected to a plurality of pixels P and a plurality of first signal lines for respectively supplying signals to the plurality of pixels P. The plurality of first signal lines include at least one signal line LS for supplying a signal for driving the pixel P. The plurality of first signal lines may be extended in a first direction (X-axis direction). The first direction (X-axis direction) may refer to a direction parallel with a scan line.

A plurality of second signal lines may be extended in a second direction (Y-axis direction). The plurality of second signal lines may cross the plurality of first signal lines. The plurality of signal lines may include a pixel power line VDDL for supplying a data voltage to the pixel P and at least one data line. Each of the second signal lines may be connected to at least one of a plurality of pads, a pixel power shorting bar or a common power shorting bar. The pixel power shorting bar and the common power shorting bar may be disposed in a third non-display area disposed to face the pad area PA based on the display area DA. The second direction (Y-axis direction) may be a direction parallel with the data line.

The pixels P may be provided to overlap at least one of the first signal line or the second signal line to emit predetermined light, thereby displaying an image. A light emission area EA may correspond to an area, which emits light, in the pixel P.

Each of the pixels P may include at least one of a first subpixel SP1, a second subpixel SP2, a third subpixel SP3 or a fourth subpixel SP4. The first subpixel SP1 may be provided to include a in first light emission area EA1 for emitting white light, the second subpixel SP2 may be provided to include a second light emission area EA2 for emitting red light, the third subpixel SP3 may be provided to include a third light emission area EA3 for emitting green light, and the fourth subpixel SP4 may be provided to include a fourth light emission area EA4 for emitting blue light, but they are not limited thereto. Each of the pixels P may include a subpixel that emits light of a color other than red, green, blue and white. In addition, various modifications may be made in the arrangement order of the subpixels SP1, SP2, SP3 and SP4.

Hereinafter, for convenience of description, the first subpixel SP1 is a white subpixel for emitting white light, the second subpixel SP2 is a red subpixel for emitting red light, the third subpixel SP3 is a green subpixel for emitting green light, and the fourth subpixel SP4 is a blue subpixel for emitting blue light.

In the transparent display apparatus 100 according to one embodiment of the present disclosure, since an organic light emitting element is provided to emit white light, the first subpixel SP1, which is a white subpixel, may not include a color filter as shown in FIGS. 2A and 4. On the other hand, the second subpixel SP2 may include a red color filter CF1 to emit red light, the third subpixel SP3 may include a green color filter CF2 to emit green light, and the fourth subpixel SP4 may include a blue color filter CF3 to emit blue light.

As shown in FIG. 2A, the first subpixel SP1 may be disposed in the first direction (X-axis direction). The second subpixel SP2, the third subpixel SP3 and the fourth subpixel SP4 may be adjacent to the first subpixel SP1, and may be disposed in the second direction (Y-axis direction). The second subpixel SP2 according to one example may be disposed to face the third subpixel SP3 and the fourth subpixel SP4 with the first signal line LS interposed therebetween. Each of the plurality of pixels P may include a first transmissive portion TR1 disposed to be adjacent to the first subpixel SP1 and the second subpixel SP2, and another first transmissive portion TR1 disposed to be adjacent to the first subpixel SP1 and the third subpixel SP3. That is, each of the plurality of pixels P may include four subpixels SP1, SP2, SP3 and SP4 and two transmissive portions TR1, as shown in FIG. 2A. The plurality of pixels P may be partitioned based on the second signal line VDDL in the first direction (X-axis direction).

The first subpixel SP1 is disposed between the transmissive portions TR1 while being adjacent to the second to fourth subpixels SP2, SP3 and SP4, so that the first subpixel SP1 may overlap the first signal line LS. As described above, since the first subpixel SP1 is a white subpixel provided to emit white light, the first subpixel SP1 does not include a color filter unlike the other subpixels. Therefore, when external light is reflected toward the first signal line LS, the first subpixel SP1 may have greater reflection visibility unlike the other subpixels provided with the color filters. In the transparent display apparatus 100 according to one embodiment of the present disclosure, the non-display area NDA may have a structure the same as or similar to that of the display area DA in order to reduce a visibility difference between the display area DA and the non-display area NDA. For example, a GIP portion GP may include a plurality of color filters to be the same as or similar to the pixel P provided in the display area DA. This will be described later in detail with reference to FIGS. 2A and 5.

Hereinafter, a pixel P of the transparent display apparatus 100 according to one embodiment of the present disclosure will be described with reference to FIGS. 1, 2A, and 4.

Referring to FIGS. 1, 2A and 4, the pixel P provided in the display area DA may include a plurality of subpixels SP and a transmissive portion TR1. As shown in FIG. 2A, the transmissive portion TR1 may be disposed to be adjacent to at least a portion of the plurality of subpixels SP. Referring to FIG. 4, each of the plurality of subpixels SP may include a buffer layer BL provided on a first substrate 110 to prevent moisture permeation to a thin film transistor 112.

In addition, each of the subpixels SP according to one embodiment of the present disclosure may include an inorganic layer 111 provided on an upper surface of the buffer layer BL, including a gate insulating layer 111a, an interlayer insulating layer 111b and a passivation layer 111c, a planarization layer 113 provided on the inorganic layer 111, a first electrode 114 provided on the planarization layer 113, a bank 115, an organic light emitting layer 116, a second electrode 117, a capping layer 118, and an encapsulation layer 119.

The thin film transistor 112 for driving the subpixel SP may be disposed in the inorganic layer 111. The inorganic layer 111 may be expressed as terms of a circuit element layer. The buffer layer BL may be included in the inorganic layer 111 along with the gate insulating layer 111a, the interlayer insulating layer 111b and the passivation layer 111c. The first electrode 114, the organic light emitting layer 116 and the second electrode 117 may be included in the light emitting element.

The buffer layer BL may be formed between the first substrate 110 and the gate insulating layer 111a to protect the thin film transistor 112. The buffer layer BL may be disposed entirely on one surface (or front surface) of the first substrate 110. The buffer layer BL may serve to prevent a material contained in the first substrate 110 from being diffused into a transistor layer during a high temperature process of the manufacturing process of the thin film transistor. Optionally, the buffer layer BL may be omitted as the case may be.

The thin film transistor 112 according to an example may include an active layer 112A, a gate electrode 112B, a source electrode 112c, and a drain electrode 112d.

The active layer 112A may include a channel area, a drain area and a source area, which are formed in a thin film transistor area of a circuit area of the pixel P. The drain area and the source area may be spaced apart from each other with the channel area interposed therebetween.

The active layer 112A may be formed of a semiconductor material based on any one of amorphous silicon, polycrystalline silicon, oxide and organic material.

The gate insulating layer 111a may be formed on the channel area of the active layer 112A. As an example, the gate insulating layer 111a may be formed in an island shape only on the channel area of the active layer 112A, or may be formed on an entire front surface of the first substrate 110 or the buffer layer BL, which includes the active layer 112A.

The gate electrode 112B may be formed on the gate insulating layer 111a to overlap the channel area of the active layer 112A.

The interlayer insulating layer 111b may be formed on the gate electrode 112B and the drain area and the source area of the active layer 112A. The interlayer insulating layer 111b may be formed in the circuit area and an entire light emission area, in which light is emitted to the pixel P. For example, the interlayer insulating layer 111b may be made of an inorganic material, but is not necessarily limited thereto.

The source electrode 112c may be electrically connected to the source area of the active layer 112A through a source contact hole provided in the interlayer insulating layer 111b overlapped with the source area of the active layer 112A.

The drain electrode 112d may be electrically connected to the drain area of the active layer 112A through a drain contact hole provided in the interlayer insulating layer 111b overlapped with the drain area of the active layer 112A.

The drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor may be provided in an overlap area between the gate electrode 112B and the source electrode 112c of the thin film transistor 112, which overlap each other with the interlayer insulating layer 111b interposed therebetween.

Additionally, in order to prevent a threshold voltage of the thin film transistor provided in a pixel area from being shifted by light, the display panel or the first substrate 110 may further include a light shielding layer (not shown) provided below the active layer 112A of at least one of the thin film transistor 112, the first switching thin film transistor or the second switching thin film transistor. The light shielding layer may be disposed between the first substrate 110 and the active layer 112A to shield light incident on the active layer 112A through the first substrate 110, thereby reducing or minimizing a change in the threshold voltage of the transistor due to external light.

The protective layer 111c may be provided on the first substrate 110 to cover the pixel area. The protective layer 111c covers the drain electrode 112d and the source electrode 112c of the thin film transistor 112 and the interlayer insulating layer 111b. The protective layer 111c may be entirely formed in the circuit area and the light emission area. For example, the protective layer 111c may be expressed as a passivation layer. The protective layer 111c may be omitted.

The planarization layer 113 may be formed on the first substrate 110 to cover the protective layer 111c. When the protective layer 111c is omitted, the planarization layer 113 may be provided on the first substrate 110 to cover the circuit area. The planarization layer 113 may be formed entirely in the circuit area and the light emission area. In addition, the planarization layer 113 may be formed on the other area except the pad area PA (or pad portion PA) in the non-display area NDA and the entire display area DA. For example, the planarization layer 113 may include an extension portion (or enlarged portion) extended or enlarged from the display area DA to the other non-display area NDA except the pad area PA. Therefore, the planarization layer 113 may have a size relatively wider than that of the display area DA.

The planarization layer 113 according to an example may be formed to be relatively thick, and thus may provide a flat surface on the display area DA and the non-display area NDA. For example, the planarization layer 113 may be made of an organic material such as photo acryl, benzocyclobutene, polyimide, and fluorine resin.

The first electrode 114 of subpixel SP may be formed on the planarization layer 113. The first electrode 114 is connected to the drain electrode or the source electrode of the thin film transistor 112 through a contact hole that passes through the planarization layer 113 and the protective layer 111c.

The first electrode 114 may be made of at least one of a transparent metal material, a semi-transmissive metal material, or a metal material having high reflectance.

When the transparent display apparatus 100 is provided in a top emission mode, the first electrode 114 may be formed of a metal material having high reflectance or a stacked structure of a metal material having high reflectance and a transparent metal material. For example, the first electrode 114 may be formed of a metal material having high reflectance, such as a stacked structure (Ti/Al/Ti) of aluminum and titanium, a stacked structure (ITO/Al/ITO) of aluminum and ITO, an Ag alloy, and a stacked structure (ITO/Ag alloy/ITO) of Ag alloy and ITO. The Ag alloy may be an alloy such as silver (Ag), palladium (Pd), and copper (Cu).

When the transparent display apparatus 100 is provided in a bottom emission mode, the first electrode 114 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

Meanwhile, the material constituting the first electrode 114 may include MoTi. The first electrode 114 may be an anode electrode or a pixel electrode.

The bank 115 is a non-light emission area in which light is not emitted, and may be provided to surround each of light emission areas (or light emitting portions) of the plurality of subpixels SP. That is, the bank 115 may partition (or define) the respective light emission areas (or light emitting portions).

The bank 115 may be formed on the planarization layer 113 to cover an edge of the first electrode 114, thereby partitioning (or defining) the light emission areas (or light emitting portions) of the plurality of subpixels SP.

The bank 115 may be formed to cover the edge of the first electrode 114 of each of the subpixels SP and expose a portion of each of the first electrodes 114. Therefore, a current is concentrated on an end of each of the first electrodes 114 to avoid a problem in which light emitting efficiency is degraded. An exposed portion of the first electrode 114 that is not covered by the bank 115 may be a light emission area (or light emitting portion).

The bank 115 may be formed of an organic layer such as an acrylic resin, an epoxy resin, a phenolic resin, a polyamide resin, and a polyimide resin, but is not limited thereto.

The organic light emitting layer 116 is formed on the first electrode 114 and the bank 115. When a voltage is applied to the first electrode 114 and the second electrode 117, holes and electrons move to the organic light emitting layer 116, respectively, and are combined with each other in the organic light emitting layer 116 to emit light.

The organic light emitting layer 116 may be formed of a plurality of subpixels SP and a common layer provided on the bank 115. In this case, the organic light emitting layer 116 may be provided in a tandem structure in which a plurality of light emitting layers, for example, a yellow-green light emitting layer and a blue light emitting layer are stacked, and may emit white light when an electric field is formed between the first electrode 114 and the second electrode 117.

A color filter suitable for a color of a corresponding subpixel SP may be formed on the second substrate 120. For example, a red color filter CF1 may be provided in a red subpixel, a green color filter CF2 may be provided in a green subpixel, and a blue color filter CF3 may be provided in a blue subpixel. A white subpixel may not include a color filter because the organic light emitting layer 116 emits white light.

The second electrode 117 is formed on the organic light emitting layer 116. The second electrode 117 may be a common layer commonly formed in the subpixels SP. The second electrode 117 may be made of a transparent metal material, a semi-transmissive metal material or a metal material having high reflectance.

When the transparent display apparatus 100 is provided in a top emission mode, the second electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

When the transparent display apparatus 100 is provided in a bottom emission mode, the second electrode 117 may be formed of a metal material having high reflectance, such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy may be an alloy of silver (Ag), palladium (Pd), copper (Cu), etc. The second electrode 117 may be an opposite electrode or a cathode electrode.

Figure 6:
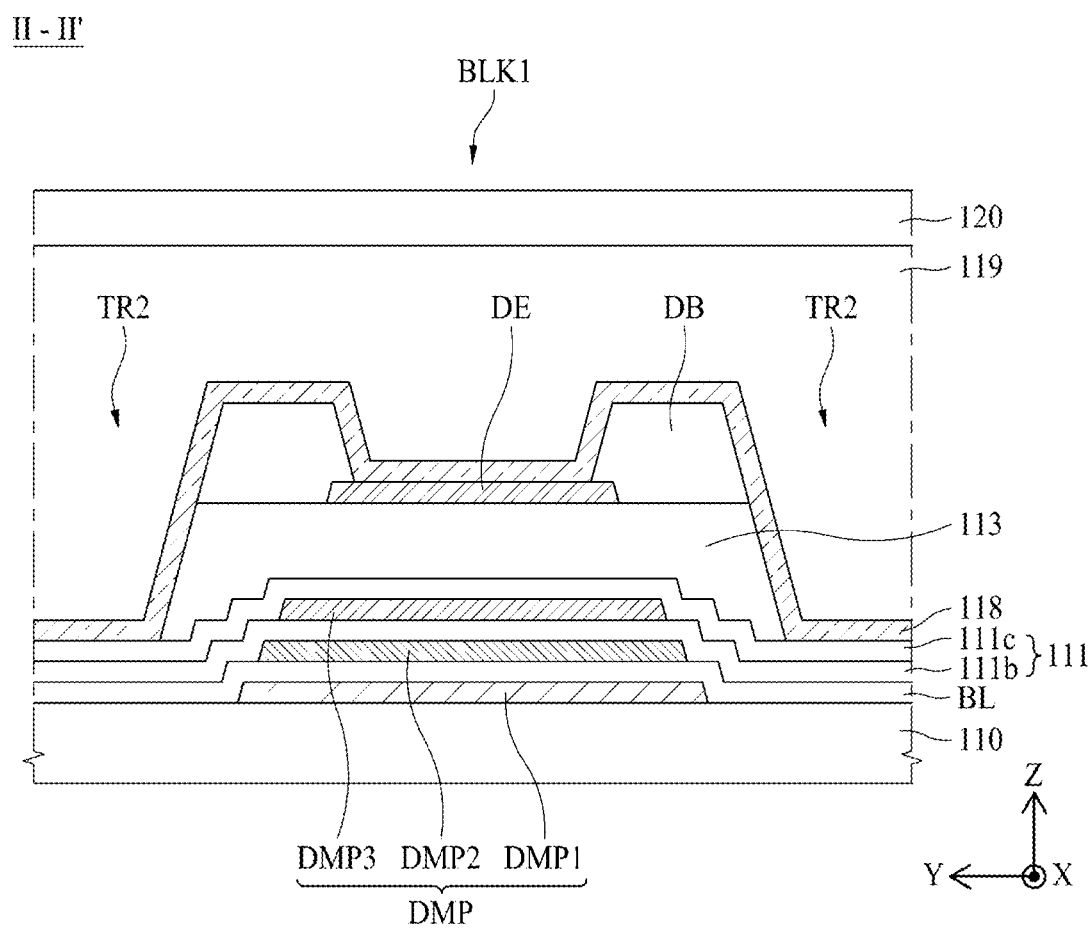
FIG. 6 is a schematic cross-sectional view taken along line II-II' shown in FIG. 5.

The capping layer 118 may be formed on the second electrode 117 but may be omitted. When the capping layer 118 is formed, the capping layer 118 may be formed entirely in the display area DA. Also, the capping layer 118 may be disposed up to the non-display area NDA as shown in FIG. 6.

The encapsulation layer 119 is formed on the capping layer 118. The encapsulation layer 119 serves to prevent oxygen or water from being permeated into the organic light emitting layer 116 and the second electrode 117. To this end, the encapsulation layer 119 may include at least one inorganic layer.

In the transparent display apparatus 100 according to one embodiment of the present disclosure, the encapsulation layer 119 may be disposed in the non-display area NDA as well as the display area DA. The encapsulation layer 119 according to one example may be disposed between the capping layer 118 and a second substrate 120.

Since the encapsulation layer 119 is disposed in the display area DA and extended to reach the non-display area NDA, the encapsulation layer 119 may be in contact with a dam (not shown) at an outer portion of the display panel. Therefore, the transparent display apparatus 100 according to one embodiment of the present disclosure may effectively prevent moisture from being permeated into the display area DA.

Referring back to FIG. 4, a color filter and a black matrix BM may be disposed between the encapsulation layer 119 and the second substrate 120. As described above, the white subpixel, i.e., the first subpixel SP1 may not include a color filter because the organic light emitting layer 116 emits white light. On the other hand, in the second subpixel SP2, which is a red subpixel, the first color filter CF1 may be provided between the encapsulation layer 119 and the second substrate 120.

As shown in FIG. 4, a black matrix BM may be provided between the first subpixel SP1 and the second subpixel SP2 to prevent a color mixture between the subpixels from occurring. The black matrix BM may be made of a black-based material, and may be disposed in a non-light emission area NEA. The black matrix BM according to one example is formed on the second substrate 120 so that at least a portion thereof overlaps the bank 115, whereby a cell gap between the organic light emitting layer 116 and the second substrate 120 may be reduced to prevent a color mixture between the subpixels from occurring.

The first subpixel SP1 may overlap the first signal line LS as shown in FIG. 2A. The first signal line LS may be provided between the buffer layer BL and the first substrate 110 in the first subpixel SP1 as shown in FIG. 4. Therefore, at least a part of the first signal line LS in the first subpixel SP1 may overlap each of a gate electrode 112B and source and drain electrodes 112c and 112d of the thin film transistor 112. That is, the first signal line LS, the gate electrode 112B and the source and drain electrodes 112c and 112d may partially overlap one another below the planarization layer 113 of the first subpixel SP1. The first signal line SL1, the gate electrode 112B and the source and drain electrodes 112c and 112d, which are provided in the first subpixel SP1, are provided in the display area DA, and thus may be expressed as terms of a pixel metal layer.

Referring to FIGS. 1 and 2A, the transparent display apparatus 100 according to one embodiment of the present disclosure may include a line portion LNP having a plurality of lines LN connected to the pad area PA, and a circuit portion GIP having a plurality of circuits GTR connected to the plurality of lines LN in the non-display area NDA. The line portion LNP and the circuit portion GIP may be provided in the non-display area NDA, more specifically the gate driver GD. In the transparent display apparatus 100 according to one embodiment of the present disclosure, since the line portion LNP and the circuit portion GIP are provided to be separated from each other in the gate driver GD, a difference in reflection visibility between the line and the circuit with respect to external light may be reduced. That is, in the transparent display apparatus 100 according to one embodiment of the present disclosure, a plurality of lines LN are disposed to be concentrated on one side of the circuit portion GIP and a plurality of circuits GTR are disposed to be concentrated on one side of the line portion LNP so that the difference in reflection visibility with respect to external light may be reduced as compared with the case that the plurality of lines and the plurality of circuits are in turn (alternately) disposed.

In more detail, referring to FIGS. 1, 2A and 2B, the line portion LNP according to one example may be disposed between an end of the first substrate 110 and the circuit portion GIP. The circuit portion GIP according to one example may be disposed between the line portion LNP and the display area DA. As shown in FIGS. 2A and 2B, the plurality of lines LN provided in the line portion LNP may include a plurality of clock lines CLK, a plurality of ground lines and a plurality of signal lines SL. For convenience of description, the plurality of clock lines CLK and a first ground line GVSS0 are only shown in FIG. 2A, and a plurality of signal lines SL, a second ground line GVSS1 and a third ground line GVSS2 are only shown in FIG. 2B. Therefore, in the transparent display apparatus 100 according to one embodiment of the present disclosure, the line portion LNP may have a structure in which all of the plurality of clock lines CLK and the first ground line GVSS0, which are shown in FIG. 2A, and the plurality of signal lines SL, the second ground line GVSS1 and the third ground line GVSS2, which are shown in FIG. 2B, are included.

The circuit portion GIP according to one example include a common control portion CUP and a buffer portion BP. The plurality of circuits GTR provided in the circuit portion GIP may include a plurality of common transistors CTR provided in the common control portion CUP and a plurality of sub buffers SBP provided in the buffer portion BP. In this case, the plurality of sub buffers SBP may refer to buffer TR provided in the buffer portion BP.

The plurality of clock lines CLK may be connected to the pad area PA to receive an image signal for driving the pixel P of the display area DA. Each of the plurality of clock lines CLK may be directly connected to each of the plurality of sub buffers SBP provided in the buffer portion BP through a first connection line CL1 to transfer the received image signal to each of the plurality of sub buffers.

Each of the plurality of sub buffers SBP may generate an image output signal for driving the pixel P based on the image signal received from the plurality of clock lines CLK. Each of the plurality of sub buffers SBP may apply the generated image output signal to the plurality of pixels P through a plurality of signal lines LS connected to the display area DA. However, each of the plurality of sub buffers SBP may finally receive a generation signal (or timing signal) of the common transistor CTR provided in the common control portion CUP and apply the image output signal to the plurality of pixels P.

A portion of the plurality of ground lines, for example, the first ground line GVSS0 may be connected to all of the plurality of sub buffers through the first connection line CL1. One side of the first ground line GVSS0 may be connected to the pad area PA, and may be connected to each of the plurality of sub buffers SBP through the first connection line CL1. The first ground line GVSS0 may receive an image output stop signal from the pad area PA to prevent the plurality of sub buffers from generating the image output signal, and may transfer the image output stop signal to each of the plurality of sub buffers SBP. As a result, the plurality of sub buffers SBP may receive an image signal through the plurality of clock lines CLK and the first ground line GVSS0 to generate or stop the image output signal for driving the pixel P.

Figure 5:
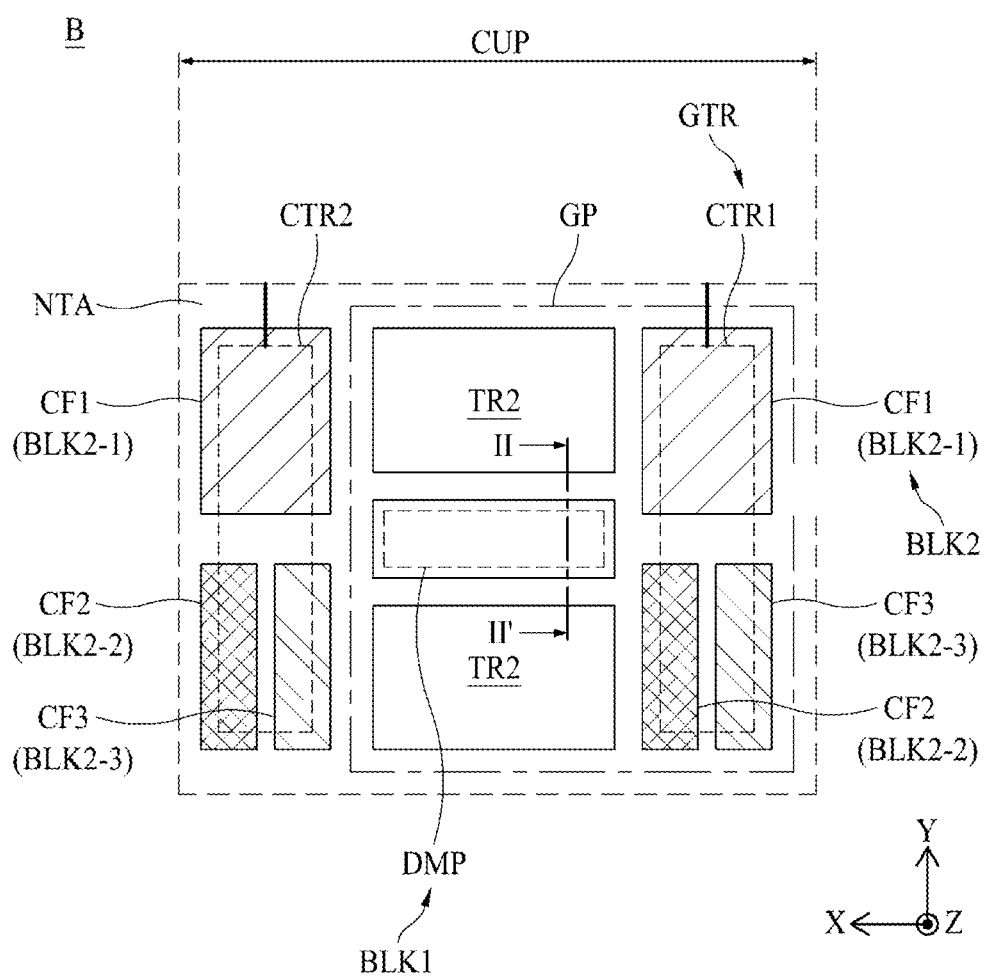
FIG. 5 is a view illustrating an example of a portion B of FIG. 2B.

As shown in FIG. 2A, the plurality of sub buffers SBP according to one example may include a first sub buffer SBP1, a second sub buffer SBP2, a third sub buffer SBP3, a fourth sub buffer SBP4, a fifth sub buffer SBP5, a sixth sub buffer SBP6, a seventh sub buffer SBP7, and an eighth sub buffer SBP8. The first sub buffer SBP1, the second sub buffer SBP2, the third sub buffer SBP3, the fourth sub buffer SBP4, the fifth sub buffer SBP5, the sixth sub buffer SBP6, the seventh sub buffer SBP7 and the eighth sub buffer SBP8 may be disposed to be spaced apart from each other in the second direction (Y-axis direction) between the common control portion CUP and the display area DA. The plurality of clock lines CLK according to one example may include a first clock line CLK1, a second clock line CLK2, a third clock line CLK3, a fourth clock line CLK4, a fifth clock line CLK5, a sixth clock line CLK6, a seventh clock line CLK7 and an eighth clock line CLK8. The first clock line CLK1, the second clock line CLK2, the third clock line CLK3, the fourth clock line CLK4, the fifth clock line CLK5, the sixth clock line CLK6, the seventh clock line CLK7 and the eighth clock line CLK8 may be spaced apart from each other in the first direction (X-axis direction) while being extended in the second direction (Y-axis direction). In FIG. 2A, each of the plurality of sub buffers SBP is shown in one quadrangle shape, but each sub buffer SBP may have a structure that includes a plurality of buffer transistors TR and a GIP transmissive portion TR2. For example, as shown in FIG. 5, each sub buffer SBP may be provided in a structure in which color filters of different colors cover the plurality of buffer TR without being overlapped with the GIP transmissive portion TR2. A first structure may be positioned between the circuit portion GIP and the line portion LNP. The first structure according to one example may be the GIP transmissive portion TR2. The GIP transmissive portion TR2 may be positioned between the plurality of lines LNP and/or between the plurality of circuits GIP. Therefore, the first structure may be positioned between the plurality of lines LNP and/or between the plurality of circuits GIP. As a result, the GIP transmissive portion TR2 as the first structure may be positioned between the plurality of lines LNP and/or between the plurality of circuits GIP.

The first clock line CLK1 may be directly connected to the first sub buffer SBP1 provided in the buffer portion BP through the first connection line CL1. The second clock line CLK2 may be directly connected to the second sub buffer SBP2 provided in the buffer portion BP through the first connection line CL1. The third clock line CLK3 may be directly connected to the third sub buffer SBP3 provided in the buffer portion BP through the first connection line CL1. The fourth clock line CLK4 may be directly connected to the fourth sub buffer SBP4 provided in the buffer portion BP through the first connection line CL1. The fifth clock line CLK5 may be directly connected to the in fifth sub buffer SBP5 provided in the buffer portion BP through the first connection line CL1. The sixth clock line CLK6 may be directly connected to the sixth sub buffer SBP6 provided in the buffer portion BP through the first connection line CL1. The seventh clock line CLK7 may be directly connected to the seventh sub buffer SBP7 provided in the buffer portion BP through the first connection line CL1. The eighth clock line CLK8 may be directly connected to the eighth sub buffer SBP8 provided in the buffer portion BP through the first connection line CL1.

As shown in FIG. 2A, the plurality of clock lines CLK and the first ground line GVSS0 may be directly connected to each of the plurality of sub buffers through the first connection line CL1. Therefore, the first connection line CL1 may be provided to cross the common control portion CUP without being connected to the common control portion CUP provided between the line portion LNP and the buffer portion BP.

Referring to FIG. 2A, the plurality of clock lines CLK and the first ground line GVSS0 may be disposed to be concentrated on one side of the common control portion CUP (or a plurality of signal lines SL) and thus spaced apart from each other in the pad non-display area PNDA. That is, in the pad non-display area PNDA, the plurality of clock lines CLK and the first ground line GVSS0 May be disposed at regular intervals without being overlapped or twisted with each other. Therefore, since the plurality of clock lines CLK and the first ground line GVSS0 are not twisted at an upper portion of the gate driver GD, more specifically in the pad non-display area PNDA, a parasitic cap generated between the lines when the lines are twisted may be reduced or a parasitic cap may not be generated.

Referring to FIG. 2B, the plurality of signal lines SL may be connected to the pad area PA to receive a pixel power source applied from the pad area PA and a control signal such as a timing control signal. Each of the plurality of signal lines SL may be connected to each of a plurality of common transistors CTR provided in the common control portion CUP through a second connection line CL2 to transfer the received timing control signal to the plurality of common transistors CTR. The plurality of common transistors CTR may be connected to the plurality of sub buffers SBP of the buffer portion BP through a buffer line BLN. The plurality of common transistors CTR may select a sub buffer, which will generate an image output signal, from the plurality of sub buffers SBP in accordance with the timing control signal received from the plurality of signal lines SL to apply a generation signal for generating the image output signal to the selected sub buffer. Therefore, the plurality of sub buffers may receive the generation signal from the common control portion CUP to generate an image output signal according to the image signal applied from the clock line CLK and apply the output signal to the plurality of pixels P.

As shown in FIG. 2B, the plurality of signal lines LN may be extended to be long in the second direction (Y-axis direction) between the first ground line GVSS0 (shown in FIG. 2A) and the common control portion CUP, and may be disposed in parallel while being spaced apart from each other in the first direction (X-axis direction). The plurality of signal lines LN may include a pixel power line VDD, a signal start line Vst, a reset line Reset, a second ground line GVSS1 and a third ground line GVSS2. The pixel power line VDD is a line connected to the pad area PA to apply a pixel power source for driving the pixel P to the common transistor CTR. The signal start line Vst is a line connected to the pad area PA to apply a start signal for allowing the pixel P to output an image to the common transistor CTR. The reset line Reset is a line connected to the pad area PA to apply a reset signal for resetting an image output by the pixel P to the common transistor CTR. The second ground line GVSS1 and the third ground line GVSS2 are lines connected to the pad area PA to apply the image output stop signal to the common transistor CTR. The signal applied to the common control portion CUP through each of the pixel power line VDD, the signal start line Vst, the reset line Reset, the second ground line GVSS1 and the third ground line GVSS2 may be transferred to any one common transistor CTR of the plurality of common transistors CTR. The one common transistor CTR may generate a control signal based on the received signal. The generated control signal may be applied to any one of the plurality of sub buffers SBP through the buffer line BLN. The sub buffer that has received the control signal may generate an image output signal, and the generated image output signal may be transferred to the pixel P provided in the display area DA through the signal line LS.

Meanwhile, referring to FIG. 2B, the plurality of signal lines SL, that is, the pixel power line VDD, the signal start line Vst, the reset line Reset, the second ground line GVSS1 and the third ground line GVSS2 may be spaced apart from each other between the clock line CLK (or the first ground line GVSS0) and the common control portion CUP. The plurality of signal lines SL, that is, the pixel power line VDD, the signal start line Vst, the reset line Reset, the second ground line GVSS1 and the third ground line GVSS2 may be disposed to be spaced apart from each other in the pad non-display area PNDA. Therefore, in the pad non-display area PNDA, the pixel power line VDD, the signal start line Vst, the reset line Reset, the second ground line GVSS1 and the third ground line GVSS2 may be disposed at regular intervals without being overlapped or twisted with each other. Therefore, at the upper portion of the gate driver GD, more specifically in the pad non-display area PNDA, the pixel power line VDD, the signal start line Vst, the reset line Reset, the second ground line GVSS1 and the third ground line GVSS2 are not twisted, so that a parasitic cap generated between the lines when the lines are twisted may be reduced or a parasitic cap may not be generated.

As a result, in the transparent display apparatus 100 according to one embodiment of the present disclosure, the plurality of lines LN may be disposed to be concentrated on one side of the circuit portion GIP and the plurality of circuits GTR may be disposed to be concentrated on the other side of the line portion LNP, so that the lines in the pad non-display area PNDA may be prevented from being twisted or overlapped with each other, whereby a parasitic cap between the lines may be reduced or may not be generated.

Referring back to FIG. 2B, the common control portion CUP may include a plurality of common lines CUL. The plurality of common lines CUL may connect the plurality of common transistors CTR to each other in the common control portion CUP. Therefore, the plurality of common transistors CTR may share power and/or timing control signals applied from the plurality of signal lines SL. This may be expressed that each of the plurality of signal lines SL shares the plurality of common transistors CTR. In the transparent display apparatus 100 according to one embodiment of the present disclosure, since the plurality of signal lines SL are provided to share the plurality of common transistors CTR, the number of second connection lines CL2 connecting each of the plurality of signal lines SL with the plurality of common transistors CTR may be reduced. Therefore, in the transparent display apparatus 100 according to one embodiment of the present disclosure, the first connection lines CL1 and the second connection lines CL2, which cross the common control portion CUP, that is, the number of the first connection lines CL1 and the second connection lines CL2, which pass between the GIP transmissive portions TR2 provided in the non-display area NDA, may be reduced as compared with the case that the plurality of lines and the plurality of circuits are alternately disposed. Therefore, in the transparent display apparatus 100 according to one embodiment of the present disclosure, since the first connection line CL1 and the second connection line CL2 do not cover the GIP transmissive portion TR2 as compared with the case that the plurality of lines and the plurality of circuits are alternately disposed, transmittance in the non-display area NDA may be improved.

The buffer portion BP may be connected to the common control portion CUP through the buffer line BLN. The buffer line BLN may include a main buffer line BLN1 and a plurality of branch buffer lines BLN2. The main buffer line BLN1 may be connected to at least one of a plurality of circuits, that is, a plurality of common transistors CTR, which are included in the common control portion CUP. The plurality of branch buffer lines BLN2 may be connected to each of the main buffer line BLN1 and the plurality of sub buffers, that is, the first to eighth sub buffers SBP1, SBP2, SBP3, SBP4, SBP5, SBP6, SBP7 and SBP8. The plurality of branch buffer lines BLN2 may be lines that connect the plurality of sub buffers SBP to each other in the buffer portion BP. Therefore, as shown in FIG. 2B, only one main buffer line BLN1 may be provided between the common control portion CUP and the buffer portion BP, and a plurality of branch buffer lines BLN2 may be provided in the buffer portion BP. Since the plurality of sub buffers SBP are connected to each other through the plurality of branch buffer lines BLN2 in the buffer portion BP, a signal of the common control portion CUP applied through the main buffer line BLN1 may be applied to any one of the plurality of sub buffers SBP.

As a result, in the transparent display apparatus 100 according to one embodiment of the present disclosure, the plurality of common transistors CTR may be connected to each other in the common control portion CUP, and the plurality of sub buffers SBP may be connected to each other in the buffer portion BP, so that the signal applied from each of the plurality of signal lines SL may be applied to any one of the plurality of common transistors CTR connected to each other, and a control signal generated by any one common transistor CTR may be applied to any one of the plurality of sub buffers SBP connected to each other to generate an output signal. Therefore, in the transparent display apparatus 100 according to one embodiment of the present disclosure, the plurality of common transistors CTR disposed in the common control portion CUP may be shared and thus the number of second connection lines CL2 connecting the line portion LNP with the common control portion CUP may be reduced. Also, in the transparent display apparatus 100 according to one embodiment of the present disclosure, the plurality of sub buffers SBP disposed inside the buffer portion BP may be shared and thus the number of the main buffer lines BLN1 connecting the common control portion CUP with the buffer portion BP may be reduced.

Therefore, in the transparent display apparatus 100 according to one embodiment of the present disclosure, since the number of each of the first connection line CL1, the second connection line CL2 and the buffer line BLN may be reduced towards a minimum, minimized, then fewer, in instances, a minimum number of the first connection lines CL1, the second connection lines CL2 and the buffer lines BLN may be disposed between the GIP transmissive portions TR2 provided in the non-display area NDA. Therefore, in the transparent display apparatus 100 according to one embodiment of the present disclosure, the plurality of lines LN may be disposed to be concentrated on one side of the circuit portion GIP and the plurality of circuits GTR may be disposed to be concentrated on the other side of the line portion LNP. That is, the plurality of lines LN and the plurality of circuits GTR may be disposed to be separated from each other.

As described above, as the plurality of lines LN and the plurality of circuits GTR are disposed to be separated from each other, the lines in the pad non-display area PNDA may be prevented from being twisted or overlapped with each other, so that the parasitic cap may be reduced, or may not be generated. Also, in the transparent display apparatus 100 according to one embodiment of the present disclosure, as the plurality of lines LN and the plurality of circuits GTR are separately disposed, a difference in reflection visibility due to external light may be improved as compared with the case that the plurality of lines and the plurality of circuits are in turn disposed (i.e., alternately disposed).

Referring to FIGS. 3A and 3B, FIG. 3A illustrates a comparative example in which a plurality of lines and a plurality of circuits are alternately arranged and is a view (or photograph) illustrating reflection visibility caused by external light. FIG. 3B is a view (or photograph) illustrating reflection visibility caused by external light when a line portion LNP including a plurality of lines LN and a circuit portion GIP including a plurality of circuits GTR are separated from each other in the transparent display apparatus 100 according to one embodiment of the present disclosure. In FIG. 3A, stripe-shaped black lines are circuits G and stripe-shaped bright lines are lines L. As shown in FIG. 3A, since a plurality of lines L and a plurality of circuits G are alternately disposed in the gate driver GD, the black lines and the bright lines, which are alternately disposed by external light, may be seen to a user more noticeable than the display area DA.

In contrast, in the transparent display apparatus 100 according to one embodiment of the present disclosure, as shown in FIG. 3B, a line portion LNP having a plurality of lines and a circuit portion GIP having a common control portion CUP and a buffer portion BP may be separated from each other, so that the line portion LNP may be seen to the user in the form of a bright area with respect to external light and the circuit portion GIP may be seen to the user in the form of a slightly darker area than the line portion LNP. Therefore, since the transparent display apparatus 100 according to one embodiment of the present disclosure may be seen to the user in the form of gradation in which brightness is gradually reduced from the line portion LNP to the display area DA as shown in FIG. 3B, the line and the circuit may not be clearly seen to the user as compared with the comparative example of FIG. 3A. Therefore, in the transparent display apparatus 100 according to one embodiment of the present disclosure, the difference in reflection visibility between the line portion LNP and the circuit portion GIP due to the external light may be reduced in the non-display area NDA as compared with the comparative example of FIG. 3A and furthermore, the difference in reflection visibility between the circuit portion GIP of the non-display area NDA and the display area DA may be reduced as shown in FIG. 3B.

In the transparent display apparatus 100 according to one embodiment of the present disclosure, the plurality of signal lines SL provided in the line portion LNP are provided to share a plurality of circuits provided in the common control portion CUP, that is, a plurality of common transistors CTR, so that the number of circuits disposed in the plurality of common control portions CUP may be reduced. Therefore, as shown in FIG. 2B, since a spatial margin may occur in the common control portion CUP, the degree of freedom in arrangement of the common transistors CTR provided in the common control portion CUP may be improved. Since the arrangement of the common transistors CTR may be freely implemented in the common control portion CUP, a width of the common control portion CUP may be designed to be reduced or minimized and thus a narrow bezel may be implemented.

FIG. 5 is a view illustrating an example of a portion B of FIG. 2B, and FIG. 6 is a schematic cross-sectional view taken along line II-II' shown in FIG. 5.

Referring to FIGS. 4 to 6, in the transparent display apparatus 100 according to one embodiment of the present disclosure, since the common transistors CTR disposed in the common control portion CUP may be freely disposed as described above, the common transistors CTR disposed in the common control portion CUP may be disposed similarly to the structure of the pixel P of the display area DA. In FIG. 2B, the arrangement of the common transistors CTR freely disposed in the common control portion CUP is described as an example, and FIG. 5 illustrates another example in which the common transistors CTR and the GIP transmissive portion TR2, which are disposed in the common control portion CUP, are provided similarly to the structure of the pixel P of FIG. 1.

As shown in FIG. 5, the common transistors CTR and the GIP transmissive portion TR2, which are disposed in the common control portion CUP, are provided similarly to the structure of the pixel P of FIG. 1, so that a visibility difference with respect to a user between the display area DA and the non-display area NDA may be reduced.

In more detail, the common control portion CUP may include a GIP portion GP similar to the structure of the pixel P of the display area DA. The GIP portion GP according to one example may include a first block portion BLK1, a second block portion BLK2 and a GIP transmissive portion TR2. The first block portion BLK1 and the second block portion BLK2 may be provided in the non-transmissive portion NTA of the non-display area NDA. The non-transmissive portion NTA may be an area that does not overlap the GIP transmissive portion TR2 in the non-display area NDA.

As shown in FIGS. 2A and 2B, the GIP transmissive portion TR2 may be provided between the plurality of lines LN and/or between the plurality of circuits GTR. That is, a plurality of GIP transmissive portions TR2 may be provided in the non-display area NDA. Since the plurality of GIP transmissive portions TR2 are provided in the non-display area NDA, the visual difference from the display area DA may be reduced, and overall transmittance of the transparent display apparatus may be improved.

The first block portion BLK1 may refer to an area that does not include a color filter in the non-display area NDA (or the common control portion CUP) and does not overlap the GIP transmissive portion TR2. That is, the first block portion BLK1 may refer to an area in which a color filter is not provided in the non-transmissive portion NTA. The first block portion BLK1 according to one example may be disposed at a position corresponding to the first subpixel SP1 in the non-transmissive portion NTA. The first block portion BLK1 may be referred to as a white block portion. The second block portion BLK2 may refer to an area disposed to be adjacent to the first block portion BLK1 in the non-display area NDA (or the common control portion CUP) and provided with a color filter. The second block portion BLK2 may be provided in the non-transmissive portion NTA that does not overlap the GIP transmissive portion TR2 to improve transmittance. The second block portion BLK2 may include a red block portion BLK2-1, a green block portion BLK2-2 and a blue block portion BLK2-3. The red block portion BLK2-1 may refer to an area in which the first color filter CF1 is provided in the common control portion CUP. The first color filter CF1 may be a red color filter, and may overlap a portion of a first common transistor CTR1. The red block portion BLK2-1 may be provided at a position corresponding to the second subpixel SP2. The green block portion BLK2-2 may refer to an area in which the second color filter CF2 is provided in the common control portion CUP. The second color filter CF2 may be a green color filter, and may overlap a portion of the first common transistors CTR1 with which the first color filter CF1 is not overlapped. The green block portion BLK2-2 may be provided at a position corresponding to the third subpixel SP3. The blue block portion BLK2-3 may refer to an area in which the third color filter CF3 is provided in the common control portion CUP. The third color filter CF3 may be a blue color filter, and may overlap a portion of the first common transistor CTR1 with which the first color filter CF1 and the second color filter CF2 are not overlapped. The blue block portion BLK2-3 may be provided at a position corresponding to the fourth subpixel SP4. The GIP transmissive portion TR2 of the non-display area NDA may be disposed at a position corresponding to the transmissive portion TR1 of the display area DA. Therefore, the GIP transmissive portion TR2 may be disposed to be adjacent to each of the first block portion BLK1 and the red block portion BLK2-1 and each of the first block portion BLK1 and the green block portion BLK2-2.

The first block portion BLK1, the second block portion BLK2 and the GIP transmissive portion TR2, which are included in the GIP portion GP, may not necessarily correspond to the first to fourth subpixels SP1, SP2, SP3 and SP4 and the transmissive portion TR1, if they have visibility the same as or similar to that of each of the first to fourth subpixels SP1, SP2, SP3 and SP4 and the transmissive portion TR1 of the pixel P.

The red block portion BLK2-1, the green block portion BLK2-2 and the blue block portion BLK2-3 of another GIP portion may be disposed at an adjacent position based on the first block portion BLK1. That is, as shown in FIG. 5, the first block portion BLK1 may be disposed between the plurality of common transistors CTR. For example, the first block portion BLK1 may be disposed between the first common transistor CTR1 and the second common transistor CTR2. A red color filter CF1 may be disposed in the red block portion BLK2-1 of another GIP portion to overlap a portion of the second common transistor CTR2. A green color filter CF2 may be disposed in the green block portion BLK2-2 of another GIP portion to overlap a portion of the second common transistor CTR2 with which the red color filter CF1 is not overlapped. A blue color filter CF3 may be disposed in the blue block portion BLK2-3 of another GIP portion to overlap a portion of the second common transistor CTR2 with which the red color filter CF1 and the green color filter CF2 are not overlapped.

For convenience of description, only a plurality of GIP transmissive portions TR2 (or GIP portions) of the plurality of GIP portions provided in the non-display area NDA (or the gate driver GD) are illustrated in FIGS. 2A and 2B. A plurality of GIP portions GP including a plurality of GIP transmissive portions TR2 may be substantially provided in the non-display area NDA (or the gate driver GD) of the transparent display apparatus 100 according to one embodiment of the present disclosure. However, since FIG. 5 illustrates that the GIP portion GP is disposed in the common control portion CUP, the color filters of different colors may cover the common transistors CTR. In contrast, the color filters of different colors may be provided to cover the plurality of lines LN in the line portion LNP.

As shown in FIG. 5, the GIP portion GP of the common control portion CUP may be provided to be the same as or similar to the pixel P of the display area DA. Therefore, in the transparent display apparatus 100 according to one embodiment of the present disclosure, a visibility difference between the display area DA and the non-display area NDA may be reduced.

The first block portion BLK1 provided in the common control portion CUP may not include a color filter. This is because the first subpixel SP1 provided in the display area DA is provided to emit white light and thus the color filter is not provided. Since the first block portion BLK1 is not provided with a color filter, when external light is emitted, reflection visibility may be greatly generated. Therefore, the transparent display apparatus 100 according to one embodiment of the present disclosure may have a structure in which the first block portion BLK1 is provided to be the same as or similar to the first subpixel SP1, thereby reducing a difference in reflection visibility with respect to external light.

The first block portion BLK1 according to one example may include at least three metal layers, such as the first subpixel SP1, which overlap one another. At least three metal layers provided in the first block portion BLK1 are provided in the non-display area NDA, and thus may be expressed as terms of a non-pixel metal layer.

Referring to FIG. 5, the first block portion BLK1 may be disposed between the second block portions BLK2. In more detail, the first block portion BLK1 may be disposed to be long in the first direction (X-axis direction), and may be disposed between adjacent second block portions BLK2. In this case, the second block portions BLK2 may refer to the second block portions BLK2 of two adjacent GIP portions GP. The second block portion BLK2 may be disposed to be long in the second direction (Y-axis direction) crossing the first direction (X-axis direction). Therefore, the first block portion BLK1 may be disposed in the form of bridge between the second block portions BLK2. As a result, the first and second block portions BLK1 and BLK2 of the non-display area NDA may be disposed to be the same as or similar to the first subpixel SP1 and each of the second to fourth subpixels SP2, SP3 and SP4 of the display area DA, whereby the visibility difference from the display area DA may be reduced.

Referring to FIGS. 5 and 6, the first block portion BLK1 may include a dummy pattern DMP provided to be the same as or similar to the first subpixel SP1. The dummy pattern DMP according to one example may be disposed between a plurality of circuits, that is, common transistors CTR. The dummy pattern DMP may be provided by stacking a plurality of metal layers (or non-pixel metal layers). Since the first block portion BLK1 is not provided with the color filter, the first block portion BLK1 is disposed to be the same as or similar to the structure of the pixel metal layer disposed in the first subpixel SP1 so as to reduce the difference in reflection visibility due to external light. For example, the first block portion BLK1 may be provided to have the same step difference as that of the pixel metal layer disposed in the first subpixel SP1, thereby reducing the difference in reflection visibility due to external light.

The dummy pattern DMP according to one example may include a first metal layer DMP1 disposed on the substrate 110, a second metal layer DMP2 disposed on the first metal layer DMP1 and a third metal layer DMP3 disposed on the second metal layer DMP2. In this case, the first metal layer DMP1 may be provided so that at least a portion thereof overlaps the second metal layer DMP2 and the third metal layer DMP3. Therefore, as shown in FIG. 6, the dummy pattern DMP may be disposed to overlap three metal layers, that is, the first to third metal layers DMP1, DMP2 and DMP3 below the planarization layer 113, and thus may be provided to be similar to the structure in which the signal line LS, the gate electrode 112B and the source electrode 112c (or the drain electrode 112d) overlap one another like the first subpixel SP1 of FIG. 4.

Referring to FIGS. 4 and 6, the first metal layer DMP1 may be provided on the same layer as the signal line LS provided on the substrate 110. The signal line LS may refer to a signal line provided on the first substrate 110 and provided in the same layer as a common voltage line (not shown) for supplying a common voltage to the pixel P. When the common voltage line is formed in the display area DA, the first metal layer DMP1 may be formed of the same material as that of the non-display area NDA (or the common control portion CPU) in the non-display area NDA. Therefore, the first metal layer DMP1 disposed in the common control portion CPU may be provided on the same layer as the common voltage line of the display area DA. For example, the first metal layer DMP1 may be disposed between the first substrate 110 and the buffer layer BL.

The second metal layer DMP2 may be provided on the same layer as the gate electrode 112B of the plurality of subpixels SP, more specifically, the first subpixel SP1. When the gate electrode 112B is formed in the display area DA, the second metal layer DMP2 may be formed of the same material as that of the common control portion CUP in the common control portion CUP. Therefore, the second metal layer DMP2 disposed in the common control portion CUP may be provided on the same layer as the gate electrode 112B of the display area DA. For example, the second metal layer DMP2 may be disposed between the interlayer insulating layer 111b and the buffer layer BL, but is not limited thereto. The second metal layer DMP2 may be disposed between the interlayer insulating layer 111b and the gate insulating layer 111a when at least a portion of the second metal layer DMP2 may overlap the first metal layer DMP1 and the third metal layer DMP3.

The third metal layer DMP3 may be provided on the same layer as the source electrode 112c provided on the gate electrode 112B provided in the first subpixel SP1. When the source electrode 112c is formed in the display area DA, the third metal layer DMP3 may be formed of the same material as that of the common control portion CPU in the common control portion CPU. Therefore, the third metal layer DMP3 disposed in the common control portion CPU may be formed on the same layer as the source electrode 112c of the display area DA. For example, the third metal layer DMP3 may be disposed between the passivation layer 111c and the interlayer insulating layer 111b. The third metal layer DMP3 disposed in the common control portion CPU may be provided on the same layer as the drain electrode 112d of the display area DA.

As a result, in the transparent display apparatus 100 according to one embodiment of the present disclosure, at least three non-pixel metal layers disposed on the same layer as at least three pixel metal layers of the first subpixel SP1 are provided to overlap one another in the first block portion BLK1, so that the difference in reflection visibility due to external light between the first subpixel SP1 and the first block portion BLK1 may be reduced. The red block portion BLK2-1, the green block portion BLK2-2 and the blue block portion BLK2-3 may be provided to be the same as or similar to the second to fourth subpixels SP2, SP3 and SP4, respectively, and in particular, include color filters having the same colors as those of the color filters of the second to fourth subpixels SP2, SP3 and SP4, respectively, so that the difference in reflection visibility due to the external light may be reduced.

Although FIG. 6 shows that the first metal layer DMP1, the second metal layer DMP2 and the third metal layer DMP3 have the same width in a flat shape, the first metal layer DMP1, the second metal layer DMP2 and the third metal layer DMP3 may have the same structure as that of the signal line LS, the gate electrode 112B and the source electrode 112c (or the drain electrode 112d) of FIG. 4.

The first block portion BLK1 may further include a planarization layer 113, a dummy electrode DE, a dummy bank DB, a capping layer 118 and an encapsulation layer 119.

The planarization layer 113 may be disposed on the passivation layer 111c in the first block portion BLK1. The planarization layer 113 of the first block portion BLK1 may be formed of the same material as that of the planarization layer 113 of the first subpixel SP1 together with the planarization layer 113 of the first subpixel SP1, and thus may be provided to have the same thickness as that of the planarization layer 113 of the first subpixel SP1.

As shown in FIG. 5, since the GIP transmissive portions TR2 are disposed in the second direction (Y-axis direction) of the first block portion BLK1, both sides of the planarization layer 113 provided in the first block portion BLK1 may be disposed to be adjacent to the GIP transmissive portions TR2.

The dummy electrode DE may be provided on the planarization layer 113 of the first block portion BLK1. The dummy electrode DE may be provided in the same as or similar structure to that of the first subpixel SP1 and thus formed in the common control portion CPU in order to reduce the visibility difference. The dummy electrode DE may be formed of the same material as that of the first electrode 114 provided in the subpixel together with the first electrode 114. The dummy electrode DE according to one example may overlap at least a portion of each of the first metal layer DMP1, the second metal layer DMP2 and the third metal layer DMP3.

In FIG. 6, since the first metal layer DMP1, the second metal layer DMP2 and the third metal layer DMP3 are provided in a flat shape, a lower surface profile of the planarization layer 113, which covers the third metal layer DMP3, may be provided to be flat. However, when the first to third metal layers DMP1, DMP2 and DMP3 are provided in the same form as the signal line LS, the gate electrode 112B and the source electrode 112c of FIG. 4, the lower surface of the planarization layer 113 covering the third metal layer DMP3 may be provided as a profile of an uneven shape. In this case, the planarization layer 113 provided between the dummy electrode DE and the third metal layer DMP3 covers the uneven shape of the third metal layer DMP3, so that an upper surface of the planarization layer 113 may be provided to be flat. Since the dummy electrode DE is disposed on the planarized upper surface of the planarization layer 113, the dummy electrode DE may be also disposed to be flat. Since the dummy electrode DE provided to be flat is disposed to overlap the metal layer of the uneven shape disposed therebelow, it is possible to reduce or prevent diffused reflection of the external light by the metal layer of the uneven shape. Therefore, the dummy electrode DE provided in the first block portion BLK1 may reduce or prevent diffused reflection of the external light with respect to the dummy pattern DMP.

Meanwhile, since the non-display area NDA (or the common control portion CPU) does not emit light, a power source (or voltage) may not be supplied to the dummy electrode DE. Therefore, the dummy electrode DE may be provided in the form of floating without being electrically connected to the third metal layer DMP3. Likewise, the first metal layer DMP1, the second metal layer DMP2 and the third metal layer DMP3 is to reduce reflection visibility with the display area DA, and thus may not be electrically connected to a driving circuit of the pad area PA. Therefore, in the transparent display apparatus 100 according to one embodiment of the present disclosure, the dummy pattern DP, that is, the first metal layer DMP1, the second metal layer DMP2 and the third metal layer DMP3 may be provided in the form of an island.

The dummy bank DB may be provided to cover an edge of the dummy electrode DE on the planarization layer 113. The dummy bank DB may be provided in the same structure as that of the bank 115 provided in the display area DA, so that the visibility difference from the display area DA may be reduced. The dummy bank DB according to one example may be formed of the same material as that of the bank 115 of the display area DA together with the bank 115.

Referring back to FIG. 6, since the non-display area NDA does not emit light, the organic light emitting layer 116 and the second electrode 117 may not be provided. Therefore, as shown in FIG. 6, the capping layer 118 may cover an upper surface of the passivation layer 111c, sides of the planarization layer 113 and an upper surface and sides of the dummy bank DB, which are exposed in the GIP transmissive portion TR2, and an upper surface of the dummy electrode DE, which is exposed between the dummy banks DB, but is not limited thereto. The organic light emitting layer 116 and the second electrode 117 may be provided on the dummy electrode DE in order to reduce the visibility difference from the display area DA. Even though the organic light emitting layer 116 and the second electrode 117 are provided on the dummy electrode DE, no power source (or voltage) is not supplied to the dummy electrode DE, so that the organic light emitting layer 116 may not emit light.

The encapsulation layer 119 may be provided to cover the capping layer 118 provided in the first block portion BLK1 and the capping layer 118 provided in the GIP transmissive portions TR2 adjacent to the first block portion BLK1. The encapsulation layer 119 provided in the non-display area NDA may include at least one inorganic layer and at least one organic layer. Therefore, the encapsulation layer 119 provided in the non-display area NDA (or the common control portion CPU) may prevent moisture from being permeated from the outside of the substrate 110 toward the display area DA.

Meanwhile, the first block portion BLK1 may not include a color filter in order to reduce a visibility difference from the first subpixel SP1. Therefore, the second substrate 120 may be disposed on the encapsulation layer 119 of the first block portion BLK1 so that the second substrate 120 may be directly in contact with the encapsulation layer 119 of the first block portion BLK1.

As a result, in the transparent display apparatus 100 according to one embodiment of the present disclosure, the structure of the GIP portion GP of the non-display area NDA is the same as or similar to that of the pixel P of the display area DA, so that a visibility difference with respect to a user between the display area DA and the non-display area NDA may be reduced, and the difference in reflection visibility due to the external light may be reduced.

In more detail, there is no color filter in the first block portion BLK1, and three non-pixel metal layers are disposed below the planarization layer 113 to overlap one another, so that the non-pixel metal layers are provided to be the same as or similar to the first subpixel SP1, whereby the difference in reflection visibility may be reduced. Since the red block portion BLK2-1 of the second block portion BLK2 includes a red color filter CF1, a visibility difference from the second subpixel SP2 and reflection visibility may be reduced. Since the green block portion BLK2-2 of the second block portion BLK2 includes a green color filter CF2, a visibility difference from the third subpixel SP3 and reflection visibility may be reduced. Since the blue block portion BLK2-3 of the second block portion BLK2 includes a blue color filter CF3, a visibility difference from the fourth subpixel SP4 and reflection visibility may be reduced.

Figure 7:
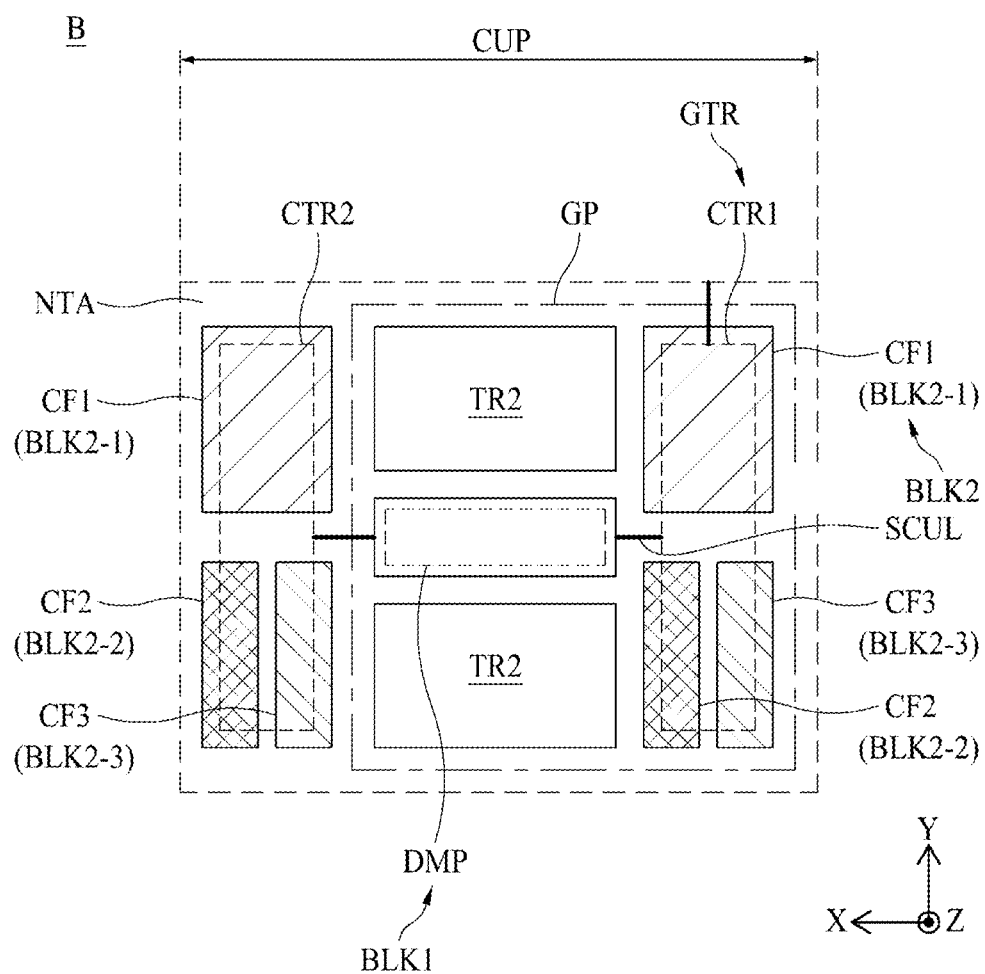
FIG. 7 is a view illustrating another example of a portion B of FIG. 2B.

FIG. 7 is a view illustrating another example of a portion B of FIG. 2B.

In case of FIG. 5, the dummy pattern DMP disposed in the common control portion CUP may be disposed in the form of island to reduce a difference in reflection visibility from the display area DA.

In contrast, in another example of FIG. 7, the dummy pattern DMP disposed in the common control portion CUP may be provided to connect a plurality of circuits, that is, the plurality of common transistors CTR in the common control portion CUP. In more detail, in case of FIG. 7, the dummy pattern DMP may be connected to the plurality of common transistors CTR through a sub common line SCUL in the common control portion CUP. In this case, the dummy pattern DMP may serve as a connection electrode or a connection line, which connects the plurality of common transistors CTR. Since each of the first metal layer DMP1, the second metal layer DMP2 and the third metal layer DMP3, each of which has a dummy pattern DMP, is made of the same metal material as that of each of the common power line, the gate electrode 112B and the source electrode 112c, at least one of the first metal layer DMP1, the second metal layer DMP2 or the third metal layer DMP3 may be used as a connection electrode (or connection line) that is connected to the sub common line SCUL to transfer a signal between the plurality of common transistors CTR, but the present disclosure is not limited thereto. At least one of the first metal layer DMP1, the second metal layer DMP2 or the third metal layer DMP3 may be used as a connection electrode (or connection line) for applying a power source to the plurality of common transistors CTR.

As described above, since the common transistors CTR may be freely disposed inside the common control portion CUP, a plurality of first block portions BLK1 may be provided between the common transistors CTR. That is, a plurality of dummy patterns DMP comprised of at least three non-pixel metal layers may be disposed at different positions between the common transistors CTR. Since the dummy patterns DMP disposed at different positions are used as connection electrodes (or connection lines) for applying a signal or power source, the number of sub common lines SCUL may be reduced as compared with the case that the dummy pattern DMP is not electrically used, whereby a width of the common control portion CUP may be further reduced. In addition, since the non-pixel metal layers provided in the dummy pattern DMP are larger in width and area than a general signal line or power line, a problem such as signal reduction or voltage drop may be solved.

As a result, the transparent display apparatus 100 according to another embodiment of the present disclosure is provided so that at least one of the first metal layer DMP1, the second metal layer DMP2 or the third metal layer DMP3 of the first block portion BLK1 is used as a connection electrode (or connection line) that connects the common transistors CTR, whereby a bezel width may be reduced, and the problem such as signal reduction or voltage drop may be solved.

According to the present disclosure, the following advantageous effects may be obtained.

In the present disclosure, since the plurality of lines and the plurality of circuits, which are provided in the non-display area, are disposed to be separated from each other, the difference in reflection visibility between the display area and the non-display area may be reduced.

Also, in the present disclosure, the plurality of lines provided in the non-display area are disposed to be concentrated on one side of the circuit portion so that the plurality of lines may be prevented from being twisted in the non-display area, whereby a parasitic cap may be prevented from being generated between the lines.

Also, in the present disclosure, since the plurality of circuits provided in the non-display area are disposed to be concentrated on the other side of the line portion, the plurality of circuits may be shared, so that the number of circuits may be reduced, whereby the degree of freedom in the buffer, etc., may be improved.

Also, in the present disclosure, since the number of circuits provided in the non-display area is reduced, the dummy pattern may be provided in a space between the circuits, so that the difference in reflection visibility due to external light between the display area and the non-display area may be further reduced.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus comprising:
a substrate having a display area and a non-display area near the display area;
a plurality of pixels in the display area, each pixel having a transmissive portion and a plurality of subpixels;
a pad area in the non-display area;
a line portion disposed in the non-display area on the substrate, the line portion having a plurality of lines connected to the pad area; and
a circuit portion in the non-display area, the circuit portion having a plurality of circuits connected to the plurality of lines in the non-display area, the circuit portion being separated from the line portion,
wherein the circuit portion includes a common control portion including a plurality of circuits and a buffer portion between the common control portion and the display area,
wherein the line portion further includes a plurality of signal lines respectively connected to the plurality of circuits of the common control portion, and
wherein the common control portion includes a plurality of common lines connecting the plurality of circuits to each other.

2. The transparent display apparatus of claim 1, further comprising a GIP transmissive portion positioned between the plurality of lines and/or between the plurality of circuits.

3. The transparent display apparatus of claim 1, wherein the non-display area includes a pad non-display area in which the pad area is disposed, and
the plurality of lines are spaced apart from each other in the pad non-display area.

4. The transparent display apparatus of claim 1, wherein the buffer portion includes a plurality of sub buffers, and
the plurality of sub buffers are connected to the common control portion through a buffer line.

5. The transparent display apparatus of claim 4, wherein the buffer line includes a main buffer line connected to at least one of the plurality of circuits included in the common control portion, and a plurality of branch buffer lines connecting the main buffer line with each of the plurality of sub buffers.

6. The transparent display apparatus of claim 1, wherein the buffer portion includes a plurality of sub buffers, and
the line portion includes a plurality of clock lines respectively connected to the sub buffers and a ground line connected to all of the plurality of sub buffers.

7. The transparent display apparatus of claim 6, wherein the plurality of signal lines is disposed in parallel between the ground line and the buffer portion.

8. The transparent display apparatus of claim 7, wherein each of the plurality of signal lines shares the plurality of circuits of the common control portion.

9. The transparent display apparatus of claim 1, wherein the common control portion further includes a dummy pattern disposed between the plurality of circuits.

10. The transparent display apparatus of claim 9, wherein the dummy pattern includes:
a first metal layer disposed on the substrate;
a second metal layer disposed on the first metal layer; and
a third metal layer disposed on the second metal layer, and
the first metal layer at least partially overlaps the second metal layer and the third metal layer.

11. The transparent display apparatus of claim 10, wherein the first metal layer is disposed on the same layer as a common voltage line provided on the substrate,
the second metal layer is provided on the same layer as a gate electrode provided in the plurality of subpixels, and
the third metal layer is provided on the same layer as a source electrode provided on the gate electrode.

12. A transparent display apparatus comprising:
a substrate having a display area and a non-display area near the display area;
a plurality of pixels in the display area, each pixel having a transmissive portion and a plurality of subpixels;
a pad area;
a line portion provided in the non-display area on the substrate, the line portion having a plurality of lines connected to the pad area; and
a circuit portion having a plurality of circuits connected to the plurality of lines in the non-display area,
wherein the circuit portion is disposed between the line portion and the display area, wherein
the circuit portion includes a common control portion including a plurality of circuits and a buffer portion between the common control portion and the display area, and
wherein the common control portion includes a plurality of common lines connecting the plurality of circuits to each other.

13. The transparent display apparatus of claim 12, wherein the non-display area includes a pad non-display area in which the pad area is disposed, and
the plurality of lines do not overlap each other in the pad non-display area.

14. The transparent display apparatus of claim 12, wherein the line portion includes a plurality of signal lines respectively connected to the plurality of circuits of the common control portion, and
each of the plurality of signal lines respectively shares the plurality of circuits of the common control portion.

15. The transparent display apparatus of claim 12, wherein the common control portion further includes a dummy pattern disposed between the plurality of circuits.

16. The transparent display apparatus of claim 15, wherein the dummy pattern includes:
a first metal layer disposed on the substrate;
a second metal layer disposed on the first metal layer; and
a third metal layer disposed on the second metal layer, and
the first metal layer at least partially overlaps the second metal layer and the third metal layer.

* * * * *